(12) United States Patent
Ho et al.

(10) Patent No.: US 6,420,886 B1
(45) Date of Patent: Jul. 16, 2002

(54) MEMBRANE PROBE CARD

(75) Inventors: Han-Shin Ho, Hsinchu Hsien; Wei-Hai Lai, Hsinchu; Chien-Shuan Kuo, Hsinchu Hsien; Deng-Tswen Shieh, Kaohsiung; Wen-Cheng Hsu, Hsinchu Hsien; Wea-Fun Fan, Hsinchu Hsien; Hann-Tsong Wang, Hsinchu Hsien; Yuh-Feng Chen, Tainan Hsien, all of (TW)

(73) Assignee: Urex Precision, Inc., Taipe (TW)

( * ) Notice: Subject to any disclaimer, the term of this patent is extended or adjusted under 35 U.S.C. 154(b) by 0 days.

(21) Appl. No.: 09/552,812

(22) Filed: Apr. 20, 2000

(30) Foreign Application Priority Data

Jan. 24, 2000 (TW) .......................... 089101112

(51) Int. Cl.[7] ............................. G01R 31/02
(52) U.S. Cl. ........................ 324/754; 324/757
(58) Field of Search ................ 324/754, 755, 324/757, 758, 765; 439/67, 73

(56) References Cited

U.S. PATENT DOCUMENTS 4,912,399 A * 3/1990 Greub et al. ............. 324/754
5,563,521 A * 10/1996 Crumly .................. 324/757
5,741,141 A * 4/1998 O'Malley ................ 439/73
5,847,571 A * 12/1998 Liu et al. ................ 324/754
5,990,695 A * 11/1999 Daugherty, Jr. .......... 324/758
6,060,891 A * 5/2000 Hembree et al. ......... 324/754

* cited by examiner

*Primary Examiner*—Michael J. Sherry
*Assistant Examiner*—Minh N. Tang
(74) *Attorney, Agent, or Firm*—Powell Goldstein Frazer & Murphy LLP

(57) ABSTRACT

A membrane probe card is provided. The membrane probe card includes a pressure mechanism having an upper-housing and a support block. The support block has a spring system for providing a distance of travel to the support block. A printed circuit board is coupled to the pressure mechanism for providing electrical connection to a test apparatus. A membrane assembly is coupled to the pads on a wafer for providing electric connection to the printed circuit board. The membrane assembly is a replaceable and modularized component for application to integrated circuits with various layouts and dimensions.

17 Claims, 4 Drawing Sheets

MEMBRANE PROBE CARD

FIELD OF THE INVENTION

The present invention is related to a membrane probe card, and, more particularly, to a replaceable modularized membrane probe card, wherein a membrane assembly is replaceable.

BACKGROUND OF THE INVENTION

Integrated circuits are typically formed on a semiconductor substrate by a series of processes, such as deposition, photolithography, and etching processes. The conductive materials, dielectric materials, and semiconductor materials having patterns or non-patterns are formed successively on a major surface of the semiconductor substrate for making an integrated circuit pattern. Recently, significant advances have been obtained to meet the need for the Ultra Large-Scale Integrated (ULSI) circuits. Semiconductor integrated circuits currently being manufactured follow ultra high-density design rules. The performance and integrity of each die circuit must be tested before the dies are cut out of the wafer and package. Testing is typically done by conductive probe card apparatus that makes physical and electrical contact with the die pads.

As shown in FIG. 1 and FIG. 2, side section and bottom plan views of a prior art high density probe card are illustrated. An epoxy ring printed circuit probe card 2 includes an aluminum ring 12, an epoxy resin 14, and probes 4 that are arranged into a lower row 4a and an upper row 4b. The probe wires 4c extend radially outwardly to traces 6 on the lower surface 8 of the probe card 2. The drawback and ultimate density limitation for the probe card 2 is that the traces 6 are formed on the same lower surface 8 and must be located at the same radial distance. The single set of traces carries all of the connections for all of the probes 4. In order for there to be sufficient spacing for radial traces 6, they must be radially spaced from the central opening 10 a sufficient distance to allow for minimum trace width and for insulative spacing between the traces 6. This close proximity leads directly to shorts and to undesirable coupling and electrical interference between the probes 4. Therefore, with the limited size of the probe card and the limited radial distances of the probe traces from center, and with the resultant construction having closeness of adjacent traces, it is extremely difficult to construct a high density probe card of the conventional type.

Besides, there are many disadvantages of the above-mentioned probe card. (1) The dimension of the chip shrinks as the density of integrated circuit increases, preventing the pads from being a layout in a matrix mode, limited by the arrangement of the probes. (2) Avoiding shorts and electrical interference between the probes, the pitch between pads is alternatingly wide. (3) The probes scrape the conductive pads after first contact with the conductive pads and cuts through any thin film of aluminum oxide or other metallic oxide. The conductive pads are damaged causing the yields of the subsequent processes to decrease and the testing variations to increase. (4) The vertical positioning of the probe tips of a probe card is not in planarization, thereby all probes make electrical connection at the different times causing different contact forces. Therefore, the ohmic contacts between the probe tips and conductive pads are influenced. (5) The oxidized probe tips of the probe card or the oxide film residue on the surface of the conductive pads are both contaminated influencing the electrical character of the probe card. Therefore, the probe card must be maintained and replaced constantly. (6) The probes of a probe card are conventionally mounted by solder, so that the solder must be removed before the probes are replaced when any probes are damaged. However, this procedure is performed by a number of apparatus, thereby the maintenance of the probe card is difficult and time-consuming. (7) The electric resistance of the conventional probe card is relative high limiting the test frequency, thereby it cannot be applied to a high frequency test.

There is a need to provide a modularized membrane probe card to overcome the disadvantages of the conventional probe as mentioned above. A plurality of bumps on the membrane assembly with circuit patterns is used to electrically connect to the pads of the tested wafer. The membrane probe card is replaceable for simply and easily changing membrane assembly on production line by an operator. The operator changes the membrane assembly according to the variable integrated circuit layout without changing the whole probe card, which decreases cost and maintenance time.

SUMMARY OF THE INVENTION

A general object of the present invention is to provide a membrane probe card, which is a module type for reducing the cost of the apparatus, and saving time for maintenance.

Another object of the present invention is to provide a membrane probe card for testing high-density integrated circuits having a matrix type layout.

A membrane probe card is disclosed according to the present invention, which comprises a pressure mechanism, a membrane assembly, and a printed circuit board. The pressure mechanism comprises an upper-housing, a spring system, and support block. The upper-housing has a plurality of first oriented openings, a plurality of second oriented openings, and a plurality of third oriented openings. The plurality of first oriented openings is used to connect the pressure mechanism and the membrane assembly to the printed circuit board to constitute the membrane probe card. The plurality of second oriented openings and the plurality of third oriented openings are used to connect the upper-housing, the spring system, and the support block to make up the stable pressure mechanism. The support block is one major feature of the present invention, which comprises a support base, a support ring, and a support block flange. The support ring has slight flexibility for assisting the spring system to result in the support base having a vertically traveling distance.

The membrane assembly is one other feature of the present invention, which is replaceable. The membrane assembly comprises a plurality of membrane regions, a membrane probe region, and a plurality of membrane connection regions. A plurality of metal bumps under the membrane probe region is used for an electrical connection to a tested wafer. A plurality of metal bumps under the plurality of the membrane connection regions is used for electrically connecting to the printed circuit board. The plurality of the membrane regions having circuit patterns thereon connect electrically the plurality of the membrane connection regions to the membrane probe region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

PREFERRED EMBODIMENT OF THE INVENTION

The present invention discloses a membrane probe card for testing a high-density integrated circuit. The membrane probe card is a module-type for simply and easily changing a membrane assembly on a production line by an operator. The operator changes the membrane assembly according to the variable integrated circuit layout, which is not as complicated as a conventional probe card, which must change any elements at original manufactory or change wholly probe card. Therefore, the membrane probe card of the present invention decreases cost and time to maintain the apparatus. After a series of testing process, the reliability of alignment of the membrane probe card is excellent. The contact between the bumps under the membrane and the pads on the integrated circuit of the tested wafer are fine, thereby the maintenance of the apparatus is easier than the conventional probe card that need complicated calibration procedures.

Figure 1:
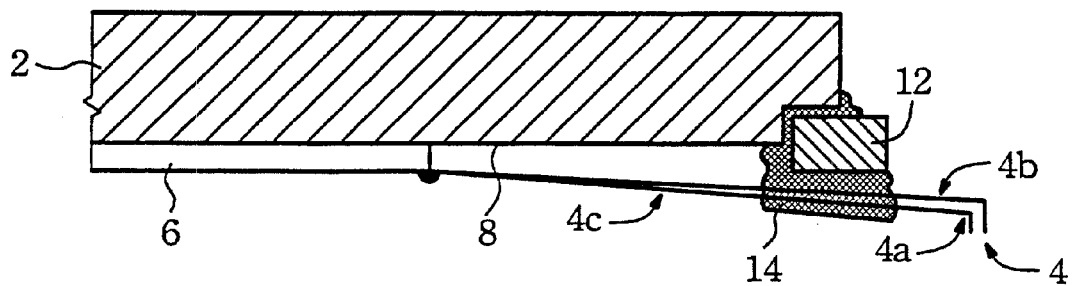
FIG. 1 represents a side section view of a conventional high-density probe card.
Figure 2:
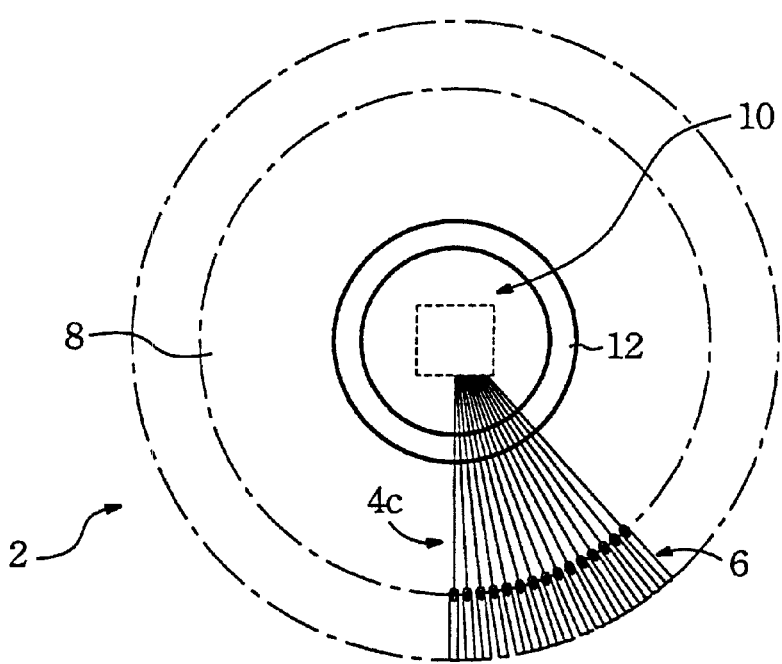
FIG. 2 represents a bottom plan view of a conventional high-density probe card.
Figure 3:
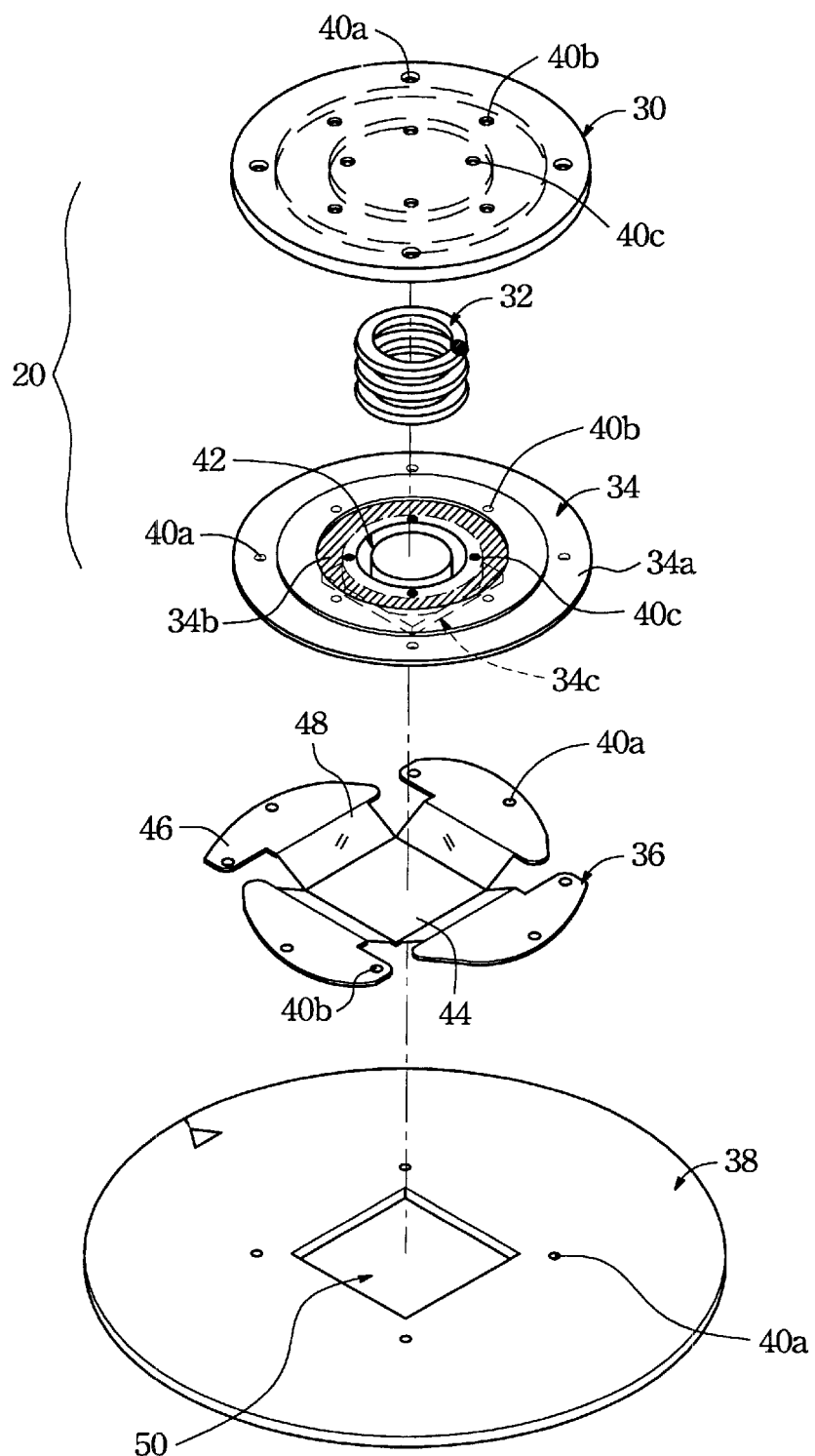
FIG. 3 illustrates an exploded perspective view of a membrane probe card in accordance with the present invention.

Referring to FIG. 3, an exploded perspective view of a membrane probe card in accordance with the present invention is illustrated. A membrane probe card is disclosed according to the present invention, which comprises a pressure mechanism 20, a membrane assembly 36, and a printed circuit board 38. The pressure mechanism 20 is used for supporting and fixing the membrane assembly 36 and the printed circuit board 38. Additionally, the pressure mechanism 20 provides an appropriate force to the membrane assembly 36 and the tested wafer for forming a fine electrical connection therebetween. The circuit of the membrane assembly 36 is formed on the membrane by a conventional semiconductor process, which is used to electrically connect the integrated circuit devices on the tested wafer to the printed circuit board 38. The printed circuit board 38 electrically connects to a testing apparatus, thereby a complete electrical connection is generated from the tested wafer to the membrane assembly 36, the membrane assembly 36 to the printed circuit board 38, and the printed circuit board 38 to the testing apparatus (not shown).

The pressure mechanism 20 comprises an upper-housing 30, a spring system 32, and support block 34. The upper-housing 30 has a plurality of first oriented openings 40a, a plurality of second oriented openings 40b, and a plurality of third oriented openings 40c. The plurality of first oriented openings 40a is used to couple the pressure mechanism 20 and the membrane assembly 36 to the printed circuit board 38 to constitute the membrane probe card. The plurality of second oriented openings 40b and the plurality of third oriented openings 40c are used to connect the upper-housing 30, the spring system 32, and the support block 34 to make up the stable pressure mechanism 20.

The support block 34 is one major feature of the present invention, which comprises a support base 34c, a support ring 34b, and a support block flange 34a. The supporting base 34c has a groove 42 for containing the spring system 32 therein and a rectangular bottom for coupling to the membrane probe region 44 of the membrane assembly. The support ring 34b is the thinnest portion of the support block 34 and is used to connect the support base 34c to the support block flange 34a. The support ring 34b has slightly flexibility to assist the spring system 32 to result in a vertical traveling distance for the support base 34c relative to the support block flange 34a.

The support block flange 34a has a plurality of first oriented openings 40a and a plurality of second oriented openings 40b, corresponding to the plurality of first oriented openings 40a and the plurality of second oriented openings 40b in the upper-housing 30. There is a plurality of third oriented openings 40c at outer-lateral of the groove 42 of the support base 34c, corresponding to the plurality of third oriented openings 40c in the upperhousing 30.

The membrane assembly 36 comprises a plurality of membrane regions 48, a membrane probe region 44, and a plurality of membrane connection regions 46. A membrane is formed on an aluminum alloy substrate and circuit patterns and metal bumps are subsequently formed on the membrane by semiconductor processes. The structure of the membrane assembly is defined by an etching process to remove a portion of the aluminum alloy substrate, thereby forming a rectangular region at the central portion of the membrane assembly and a plurality of connection regions 46 at the peripheral portion of the membrane assembly. The central portion of the membrane assembly with a rectangular region functions as a membrane probe region 44. A plurality of metal bumps formed under the membrane probe region 44 electrically connects with the tested wafer while a plurality of metal bumps under the membrane connection regions 46 connect with the printed circuit board 38. The plurality of membrane regions 48 with circuit patterns electrically connects the membrane probe region 44 to the membrane connection regions 46.

The printed circuit board 38 comprises a plurality of first oriented openings 40a corresponding to the plurality of first oriented openings 40a in the membrane assembly 36, in the support block 34, and in the upper-housing 30. The plurality of first oriented openings 40a is used to connect and fix the above-mentioned elements to form the membrane probe card of the present invention. A rectangular opening 50 is formed at the central portion of the printed circuit board 38 for positioning the membrane probe region 44 of the membrane assembly 36 coupling with the support base 34c to pass through. The membrane probe region 46 connects electrically with the tested wafer through the membrane regions 48 to pads of the printed circuit board 38, thereby the tested wafer electrically connects to the testing apparatus.

Figure 4:
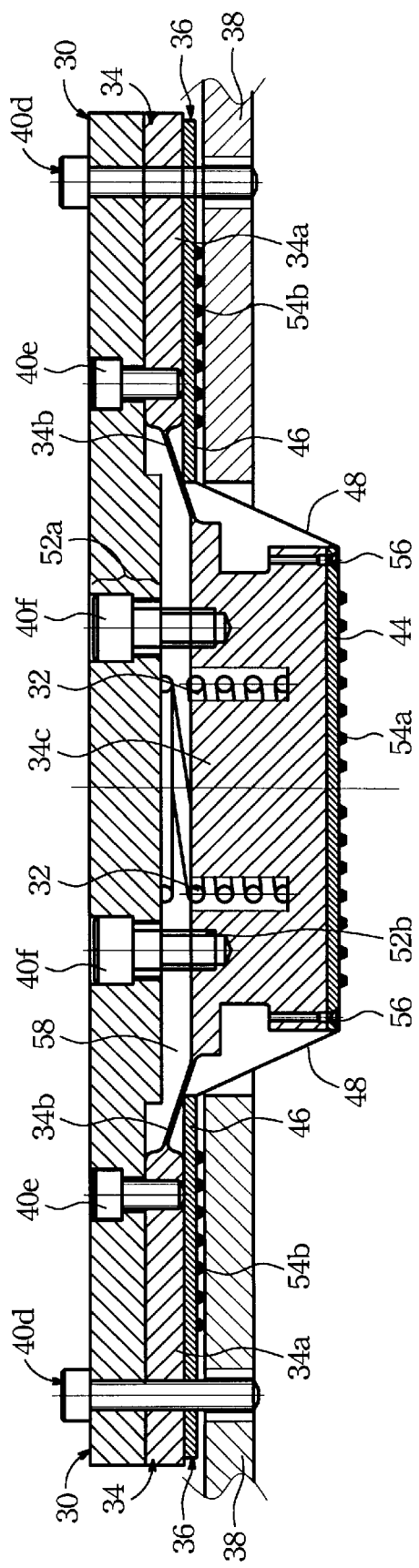
FIG. 4 illustrates a cross-sectional view of a membrane probe card in accordance with the present invention at a non-operative status.

Next, referring to FIG. 4, a cross-sectional view of a membrane probe card in accordance with the present invention at its non-operative status is illustrated. A plurality of third oriented elements 40f firstly pass through the plurality of third oriented openings 40c in the upper-housing 30 and support base 34c to connect the upper-housing 30 and the spring system 32 with the support base 34c of the support block 34. The spring system 32 is positioned in the groove 42 of the support base 34c. Subsequently, a plurality of second oriented elements 40e passes through the plurality of second oriented openings 40b in the upper-housing 30 and support block flange 34a to connect the upper-housing 30 and the spring system 32 with the support base 34c of the support block 34. Then, a plurality of first oriented elements 40d passes through the plurality of first oriented openings 40a in the upper-housing 30, the support block flange 34a, the membrane assembly 36, and the printed circuit board 38. The plurality of first oriented elements 40d connects the pressure mechanism 20, and the membrane connection regions 46 of the membrane assembly 36 with the printed circuit board 38. The membrane probe region 44 of the membrane assembly 36 is connected to the bottom of the support base 34c by a plurality of screws 56. Thus, a membrane probe card is established that is a simple, oriented, aligned finely, and stable membrane probe card. In one preferred embodiment, the first oriented elements 40d, the second oriented elements 40e, and the third oriented elements 40f are bolts or screws.

The membrane probe card of the present invention is a module-type apparatus, wherein the membrane assembly 36 is a replaceable component. The first oriented elements 40d and the screws 56 are removed from the membrane probe card for changing the membrane assembly 36 by the operator, thereby the pressure mechanism 20, the membrane assembly 36, and the printed circuit board 38 are separated, respectively. After the membrane assembly is removed, a new membrane assembly is positioned and is fixed by the first oriented elements 40d to compose the pressure mechanism 20, the new membrane assembly 36, and the printed circuit board 38. The screws 56 are used to fix the membrane probe region 44 of the membrane assembly 36 to the bottom of the support base 34c. Therefore, the module-type membrane probe card of the present invention apparently reduces maintenance time and cost, wherein the membrane assembly 36 is replaced by a simple procedure without changing the pressure mechanism 20.

Referring to FIG. 4, when the membrane probe card is at a non-operative status, a gap 58 is formed between the upper-housing 30 and the support base 34c owing to the function of the spring system 32. The gap 58 provides a traveling distance to the support base 34c while the membrane probe card contacts the tested wafer. The gap 58 is also formed owing to the flexibility of the support ring 34b in addition to the spring system 32. The support ring 34b of the support block 34 provides a lateral traction force preventing the support base 34c from lateral tilting or shift while traveling.

Another important feature of the pressure mechanism 20 is the third oriented elements 40f and the third oriented openings 40c. The third oriented elements 40f comprise upper portions 52a and lower portions 52b. The lower portions 52b have a plurality of screw threads for fixing the support base 34c to the upper-housing 30, which avoids the upper-housing 30 separating from the support base 34c by the spring system 32. The upper portions 52a have no screw threads such as a sleeve for directing the support base 34c to travel vertically. Thus, the support base 34c is forced to compress inwardly without lateral tilting or shifting. The support base 34c moves vertically to provide appropriate force to the membrane probe region 44 of the membrane assembly 36 during the testing process. The metal bumps under the membrane probe region 44 contact well and electrically connect with the pads of the integrated circuits on the tested wafer, thereby the traveling of the support base 34c will not cause misalignment between the bumps and pads.

In a preferred embodiment of the present invention, bumps 54a and 54b are formed under the membrane probe region 44 and the membrane connection regions 46, respectively. The circuit patterns on the membrane assembly 36 electrically connect between the membrane probe region 44 and the membrane connection regions 46. When the membrane probe card is composed completely, the membrane probe region 44 coupling with the support base 34c pass through the opening 50 of the printed circuit board 38 to project downwardly below the printed circuit board 38. The bumps 54b under the membrane connection regions 46 contact with the pads of the printed circuit board 38 to form fine electrical connection. The bumps 54a under the membrane probe region 44 electrically connect with the pads of integrated circuits on the tested wafer. Especially, the membrane assembly 36 and the support block 34 are restricted laterally by support ring 34b, thereby the membrane regions 48 of the membrane assembly 36 are not forced. The lifetimes of the membrane regions 48 relatively increase without stress damage.

Figure 5:
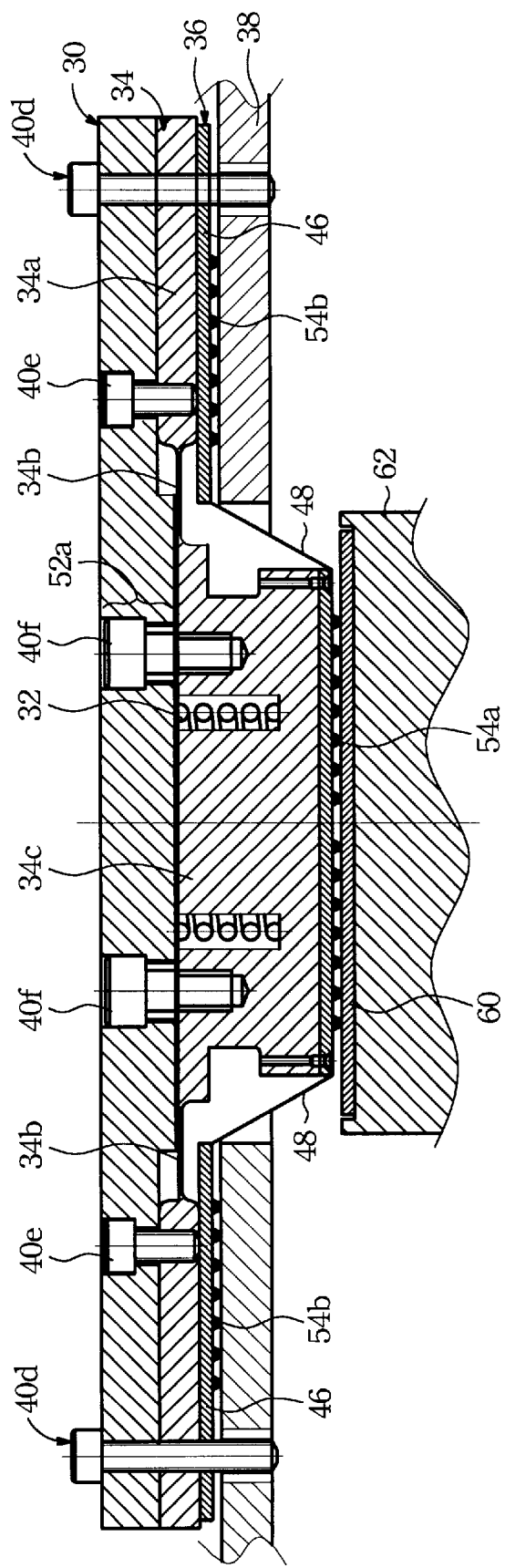
FIG. 5 illustrates a cross-sectional view of a membrane probe card in accordance with the present invention at an operative testing status.

Referring to FIG. 5, a cross-sectional view of a membrane probe card in accordance with the present invention at testing status is illustrated. When the testing procedure is performed, the pressure mechanism 20 and the wafer carrier 62 provide respectively appropriate contact forces to the membrane probe region 46 and the tested wafer 60. The bumps 54a of the membrane assembly 36 contact the pads of integrated circuits on the tested wafer 60 to form a fine electrical connection between the bumps 54a and the pads (not shown). When the tested wafer 60 contacts the membrane assembly, the spring system 32 provides a buffer force to the support base 34c to traveling upwardly.

The spring system 32 provides elasticity and reaction force to the support base 34c before and after the membrane assembly 36 contacts with the tested wafer 60. The spring system 32 assimilates any uneven active force applied to the support base 34c that has a traveling distance after the membrane assembly 36 contacts the tested wafer 60. Guiding by the third oriented openings 40c and the third oriented elements 40f while shifting upwardly and downwardly, the bottom of the support base 34c is maintained at horizontal status without lateral shifting or tilting. Additionally, the support ring 34b of the support block 34 also provides vertical flexibility for support base 34c without tilting while shifting upwardly and downwardly. The bottom of the support base 34c provides a reference plane for the membrane assembly 36. The reference plane coupling with the membrane assembly 36 shifts upwardly and downwardly pressured by the spring system 32, and thereby has a vertical traveling distance without lateral shifting or tilting.

As mentioned above, the membrane probe card according to the present invention has the following advantages. (1) The metal bumps of the present membrane probe card are formed to a matrix pattern, so as to improve the density limitation of the integrated circuits on a wafer. (2) The membrane assembly of the present membrane probe card is replaced on the production line without a number of calibration apparatus, thereby apparently reducing maintenance time of the membrane probe card. (3) The membrane assembly of the present membrane probe card is used for testing a wafer having higher density of integrated circuits. The pitches between metal bumps of the membrane assembly are narrower apparently than the conventional probe card. (4) The metal bumps on the membrane assembly of the present membrane probe card have a lower damage than the conventional probe card to the conductive pads, thereby the qualities of conductive pads are increased so as to increase the yields of the subsequent processes. (5) The membrane probe card according to the present invention can control characteristics resistant to be applied to a high frequency test.

As is understood by a person that skilled in the art, the foregoing preferred embodiment of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A membrane probe apparatus for providing electrical connection between a tested wafer and a testing apparatus, wherein said membrane probe apparatus comprising:

a printed circuit board for providing electrical connection to said testing apparatus;

a membrane assembly for providing electrical connection between said tested wafer and said printed circuit board, wherein said membrane assembly comprises a membrane probe region, a plurality of membrane connection regions, and a plurality of membrane regions that electrically connect said membrane probe region to said plurality of membrane connection regions;

a pressure mechanism for supporting and fixing said membrane assembly and said printed circuit board as testing process performing, wherein said pressure mechanism comprises an upper-housing, a spring system, and a support block comprising a support base having a groove for positioning said spring system therein and whose bottom couples said membrane probe region by a plurality of screws, a support flange, and a support ring connecting said support flange to said support base, and when said pressure mechanism is positioned at non-operated status, a gap is formed between said support base and said upper-housing by said spring system to provide a traveling distance to said support base; and oriented means for orienting said pressure mechanism and said membrane assembly to said printed circuit board.

2. The membrane probe apparatus according to claim 1, wherein said support ring has a vertical flexibility for assisting said spring system resulting said support base has a traveling distance.

3. The membrane probe apparatus according to claim 1, wherein said a plurality of membrane region provides an electrical connection between said membrane probe region and said a plurality of membrane connection region.

4. The membrane probe apparatus according to claim 1, wherein said membrane probe region has a plurality of first bumps to provide an electrical connection between said membrane assembly and said tested wafer.

5. The membrane probe apparatus according to claim 1, wherein each of said a plurality of membrane connection region has a plurality of second bumps to provide an electrical connection between said printed circuit board and said membrane assembly.

6. The membrane probe apparatus according to claim 1, wherein said oriented means comprise a plurality of first oriented elements, a plurality of second oriented elements, and a plurality of third oriented elements.

7. The membrane probe apparatus according to claim 6, wherein said plurality of first oriented elements are used for coupling said printed circuit board and said membrane assembly to said pressure mechanism.

8. The membrane probe apparatus according to claim 6, wherein said plurality of second oriented elements are used for coupling said upper-housing to said support block.

9. The membrane probe apparatus according to claim 6, wherein said plurality of third oriented elements are used for coupling said upper-housing and said spring system to said support block.

10. The membrane probe apparatus according to claim 6, wherein said membrane assembly is replaceable by removing said plurality of first oriented elements and a plurality of screws.

11. A pressure mechanism for membrane probe apparatus, said pressure mechanism comprising:

a spring system for providing elasticity to said pressure mechanism resulting a traveling distance;

a support block comprising a support base, a support ring, and a support flange, wherein said support base has a groove for positioning said spring system therein, said support ring connects said support flange with said support base to provide a lateral traction force preventing said support base from tilting;

an upper-housing for fixing said spring system and said support block, wherein said upper-housing has a plurality of first oriented openings and a plurality of second oriented openings; and oriented means for orienting and fixing said upper-housing, said spring system, and said support block to form said pressure mechanism.

12. The pressure mechanism according to claim 11, wherein said support ring has vertical flexibility for assisting said spring system resulting said support base having a traveling distance.

13. The pressure mechanism according to claim 11, wherein said pressure mechanism is positioned at non-operated status, a gap is formed between said support base and said upper-housing by said spring system to provide a traveling distance to said support base.

14. The pressure mechanism according to claim 11, wherein said oriented means comprise a plurality of first oriented elements and a plurality of second oriented elements.

15. The pressure mechanism according to claim 14, wherein said plurality of first oriented elements is used for coupling said upper-housing through said plurality of first oriented openings to said support base.

16. The pressure mechanism according to claim 14, wherein said plurality of second oriented elements is used for coupling said upper-housing through said plurality of second oriented openings to said support flange.

17. The pressure mechanism according to claim 14, wherein said plurality of first oriented elements has a lower portion for fixing said support base and an upper portion for directing said support base to travel vertically.

* * * * *